(12) United States Patent
Clevenger et al.

(10) Patent No.: US 6,794,721 B2
(45) Date of Patent: Sep. 21, 2004

(54) INTEGRATION SYSTEM VIA METAL OXIDE CONVERSION

(75) Inventors: Lawrence A. Clevenger, LaGrangeville, NY (US); Louis L. Hsu, Fishkill, NY (US); Carl J. Radens, LaGrangeville, NY (US); Joseph F. Shepard, Jr., Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/328,650

(22) Filed: Dec. 23, 2002

(65) Prior Publication Data

US 2004/0119128 A1 Jun. 24, 2004

(51) Int. Cl.[7] ............ H01L 29/76; H01L 29/84; H01L 31/062; H01L 31/113; H01L 31/119
(52) U.S. Cl. ............ 257/369; 257/382; 257/384
(58) Field of Search ............ 257/20, 24, 192, 257/202, 288, 310, 368, 369, 382, 384, 388, 412, 413

(56) References Cited

U.S. PATENT DOCUMENTS 6,657,244 B1 * 12/2003 Dokumaci et al. .......... 257/288

* cited by examiner

Primary Examiner—Hoai Pham
(74) Attorney, Agent, or Firm—McGinn & Gibb, PLLC; Derek S. Jennings (57) ABSTRACT

A method and structure for a transistor device comprises forming a source, drain, and trench region in a substrate, forming a first insulator over the substrate, forming a gate electrode above the first insulator, forming a pair of insulating spacers adjoining the electrode, converting a portion of the first insulator into a metallic film, converting the metallic film into one of a silicide and a salicide film, forming an interconnect region above the trench region, forming an etch stop layer above the first insulator, the trench region, the gate electrode, and the pair of insulating spacers, forming a second insulator above the etch stop layer, and forming contacts in the second insulator. The first insulator comprises a metal oxide material, which comprises one of a $HfO_x$ and a $ZrO_x$.

20 Claims, 8 Drawing Sheets

INTEGRATION SYSTEM VIA METAL OXIDE CONVERSION

BACKGROUND OF THE INVENTION

1. Field of the Invention

The present invention generally relates to microelectronic integrated circuits, and more particularly to a metal-oxide-semiconductor field-effect transistor (MOSFET) device and a method for producing the same.

2. Description of the Related Art

Advanced generations of microelectronic integrated circuits use metal-oxide-semiconductor field-effect transistor (MOSFET) devices with gate insulator materials having a dielectric constant greater than that of silicon dioxide and silicon-oxy-nitride materials. $HfO_x$ and $ZrO_x$ materials have been proposed as high-k gate insulator materials. In fact, it is desirable to incorporate these gate insulator materials into a complementary n-channel and p-channel MOSFET (CMOS) process. Moreover, these high-k materials have been used as an etch-stop film, wherein after the etching occurs, the stop film in the connect area of the MOSFET device is converted to metal by a specific annealing process.

For example, in studies examining the effects of $ZrO_2$ and Zr silicate ($Zr_{27}Si_{10}O_{63}$) gate dielectrics deposited on silicon substrates, these high-k materials showed excellent equivalent oxide thicknesses (EOT) of 9.9 angstroms ($ZrO_2$) and 9.6 angstroms ($Zr_{27}Si_{10}O_{63}$), with very low leakage currents of 20 mA/cm$^2$ and 23 mA/cm$^2$, respectively (C. H. Lee et al., "MOS Characteristics of Ultra Thin Rapid Thermal CVD $ZrO_2$ and Zr Silicate Gate Dielectrics," IEEE Tech. Dig., 2000, the complete disclosure of which is herein incorporated by reference). In another study, $HfO_2$ demonstrated equally as well, having an EOT of 10.4 angstroms and a leakage current of 0.23 mA/cm$^2$ (S. J. Lee et al., "High Quality Ultra Thin CVD $HfO_2$ Gate Stack with Poly-Si Gate Electrode," IEEE Tech. Dig., 2000, the complete disclosure of which is herein incorporated by reference).

However, due to the ever-increasing performance required of MOSFET devices, and the lack of a conventional device capable of meeting performance specifications, there is a need for a new and improved structure and method of manufacturing a high-performance MOSFET device capable of achieving present and future technological specifications for integrated circuit technology.

SUMMARY OF THE INVENTION

The present invention has been devised to provide a structure and method for manufacturing a high performance MOSFET device. The present invention provides a structure which integrates a combination of a high dielectric constant gate insulator and a low-resistance metal silicide source/drain region in a self-aligned manner without incurring extra processing cost. The present invention provides a method which reduces the number of processing steps used to manufacture a MOSFET device having a high-dielectric constant gate insulator and a low-resistance silicide (salicide) source/drain region relative to conventional MOSFET devices. The present invention provides a method for converting a metal oxide thin film to a metallic thin film in selected source/drain regions such that a subsequent annealing process will convert the metallic film to a silicide (salicide) film in order to improve the device series resistance.

There is provided, according to one aspect of the invention a new self-aligned and low-cost silicidation process. While forming a MOS device with a high-k gate dielectric using a proper metal oxide such as $HfO_x$ or $ZrO_x$, the remaining high-k dielectric in the source/drain regions exposed to the air are converted into metal. One feature of the present process is the ability to block the high-k dielectric, which directly contacts the gate conductor, by using a cap dielectric layer. A subsequent silicidation process forms silicide alloy only in the source/drain region to reduce device series resistance. By controlling the metal conversion processing step, the overlap capacitance due to the gate and source/drain overlap with the high-k dielectric is also minimized. The high-k dielectric on top of the insulating substrate can also be used to form resistors. In short, a low-cost fabrication method to integrate very high-performance active and passive devices is taught in this disclosure.

Specifically, according to the present invention, a transistor device, and method of forming the same, is disclosed comprising forming a source region, a drain region, and a trench region in a substrate. Then, a first insulator is formed over the substrate. Next, a gate electrode is formed above the first insulator. Upon completion of this step, a pair of insulating spacers are formed adjoining the electrode. Next, a portion of the first insulator is converted into a metallic film. Then, at least a portion of the metallic film is converted into one of a silicide and a salicide film.

The method further comprises forming an interconnect region above the trench region and forming an etch stop layer above the first insulator, the trench region, the gate electrode, and the pair of insulating spacers. Next, a second insulator is formed above the etch stop layer, and finally, contacts are formed in the second insulator. The first insulator comprises a metal oxide material, and specifically, comprises one of a $HfO_x$ and a $ZrO_x$.

In the step of converting a portion of the first insulator into a metallic film, the portion of the first insulator comprises a region above the source and the drain regions of the substrate. Moreover, the step of converting the metallic film into one of a silicide and a salicide film occurs in a region above the source and drain regions of the substrate. Furthermore, the step of converting a portion of the first insulator into a metallic film occurs by annealing in a reducing ambient environment. Additionally, the step of converting the metallic film into one of a silicide and a salicide film occurs by one of an annealing process and a wet etching process.

Also, a transistor device is disclosed comprising a substrate with a metal oxide film above the substrate, a gate electrode above the metal oxide film, and spacers adjacent to the gate electrode. The metal oxide film has a first region below the gate electrode and second regions not protected by the gate electrode. Moreover, the second regions have a reduced oxygen content when compared to the first region. Also, the second regions extend partially under the spacers. The transistor device in the second portions includes a silicide region and further comprises a source and drain region in the substrate below the second regions. Finally, the first region comprises a gate insulator.

According to the present invention, the performance of a MOSFET device is influenced by the dielectric properties of the thin gate insulator, and the series resistance of the source/drain region of the transistor. Additionally, the device's transconductance is increased, by the introduction of a high-dielectric constant gate insulator.

Moreover, according to the present invention, the series resistance of the source/drain region of the transistor is reduced by the introduction of a metal silicide on the surface of the source/drain region. Also, the gate to source/drain overlap capacitance is reduced by minimizing the overlap area using a self-aligned processing scheme.

BRIEF DESCRIPTION OF THE DRAWINGS

The invention will be better understood from the following detailed description of preferred embodiments of the invention with reference to the drawings, in which.

DETAILED DESCRIPTION OF PREFERRED EMBODIMENTS OF THE INVENTION

As previously mentioned, there is a need for an improved structure and method for manufacturing a high performance MOSFET device capable of achieving present and future technological specifications for integrated circuit technology. According to the present invention, a new and improved structure and method for manufacturing a high performance MOSFET device is disclosed.

Figure 4:
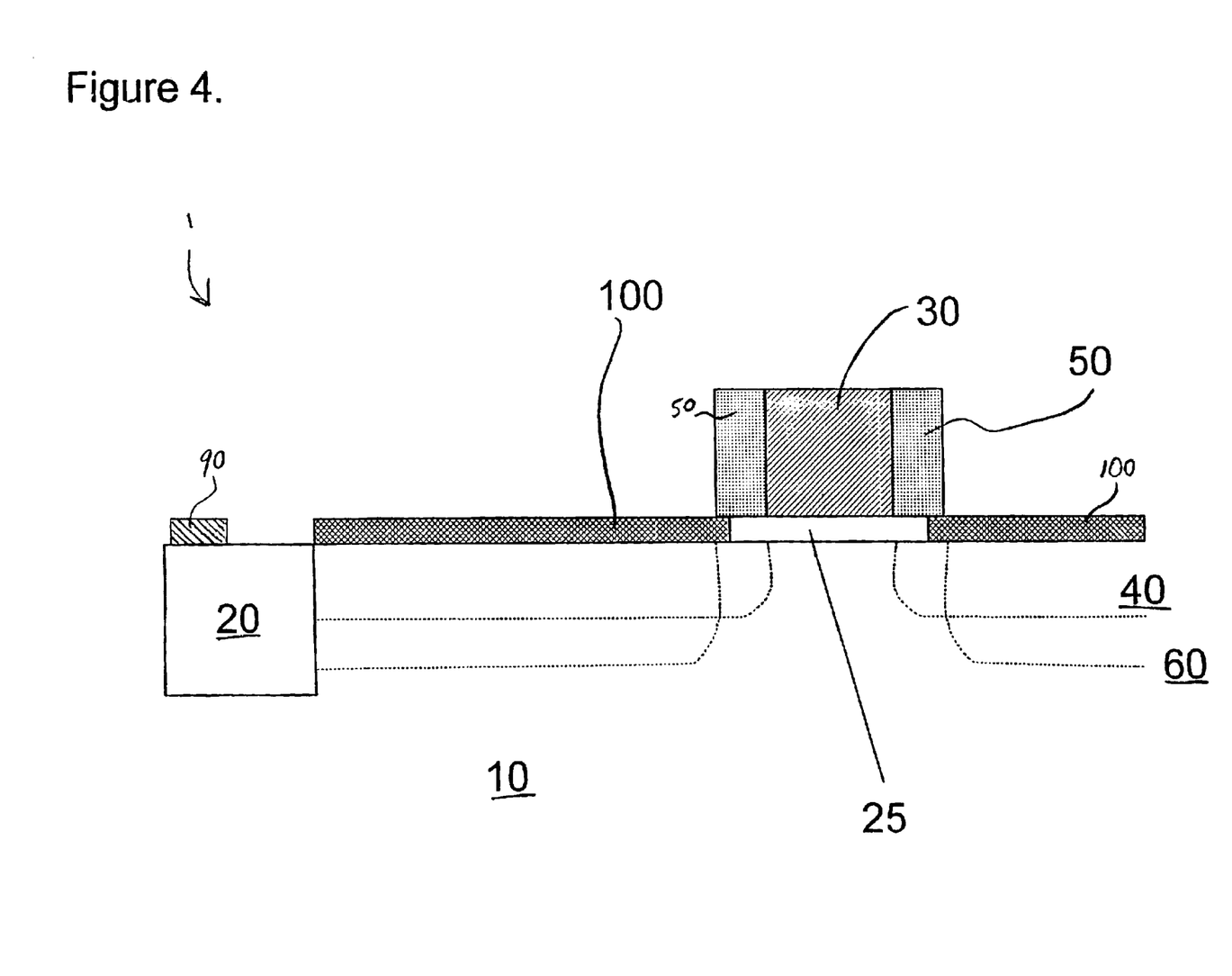
FIG. 4 is a cross-sectional schematic diagram of a partially completed metal-oxide-semiconductor field-effect transistor device according to the present invention.
Figure 5:
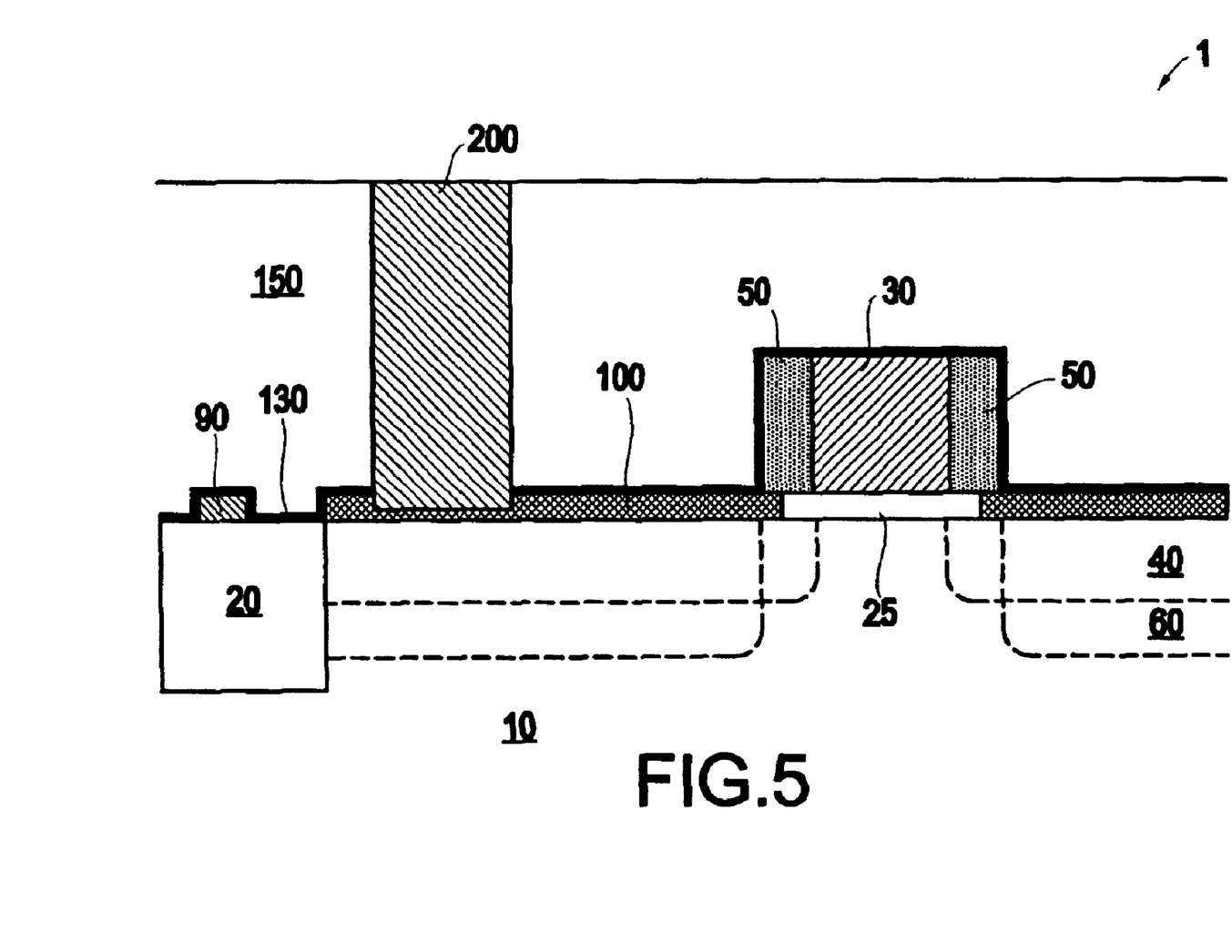
FIG. 5 is a cross-sectional schematic diagram of a partially completed metal-oxide-semiconductor field-effect transistor device according to the present invention.
Figure 6:
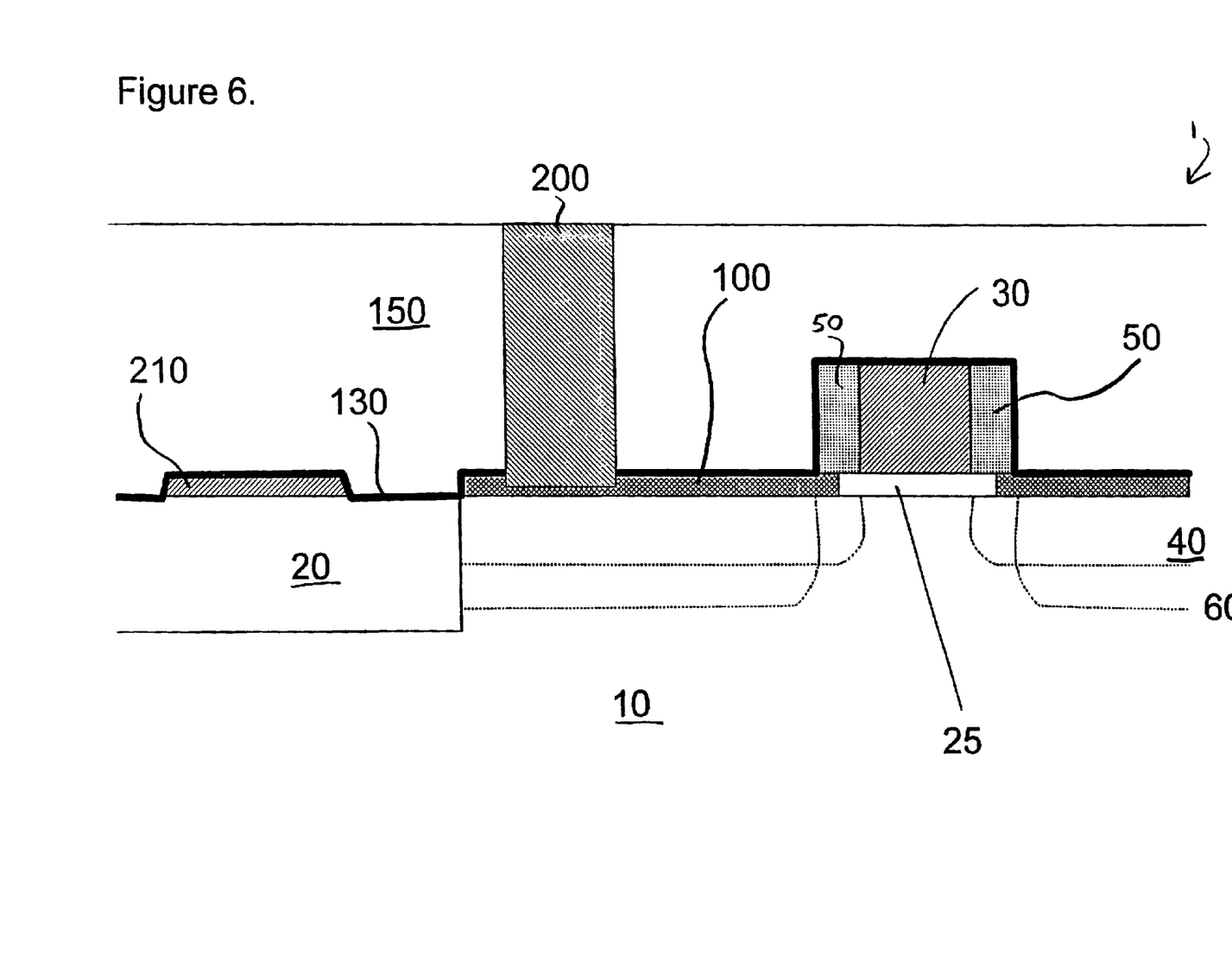
FIG. 6 is a cross-sectional schematic diagram of a completed metal-oxide-semiconductor field-effect transistor device according to the present invention.
Figure 7:
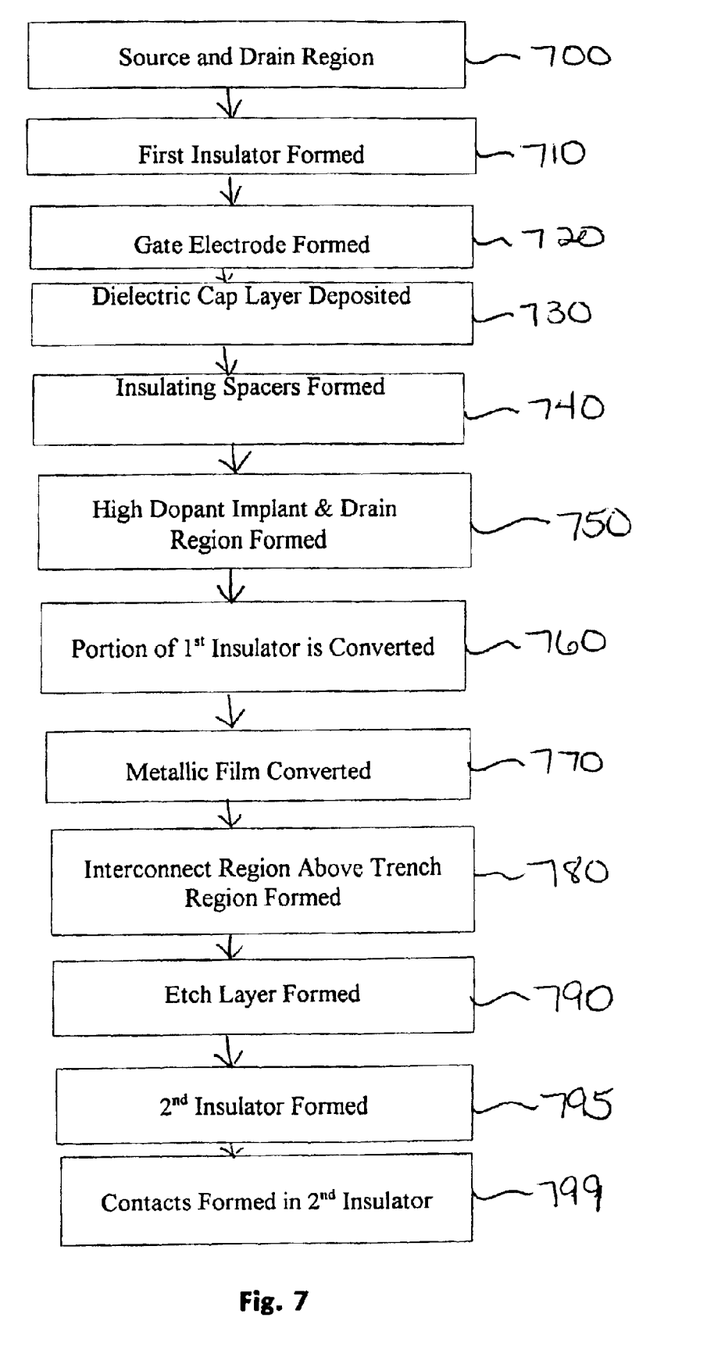
FIG. 7 is a flow diagram illustrating a preferred method of the invention.
Figure 8:
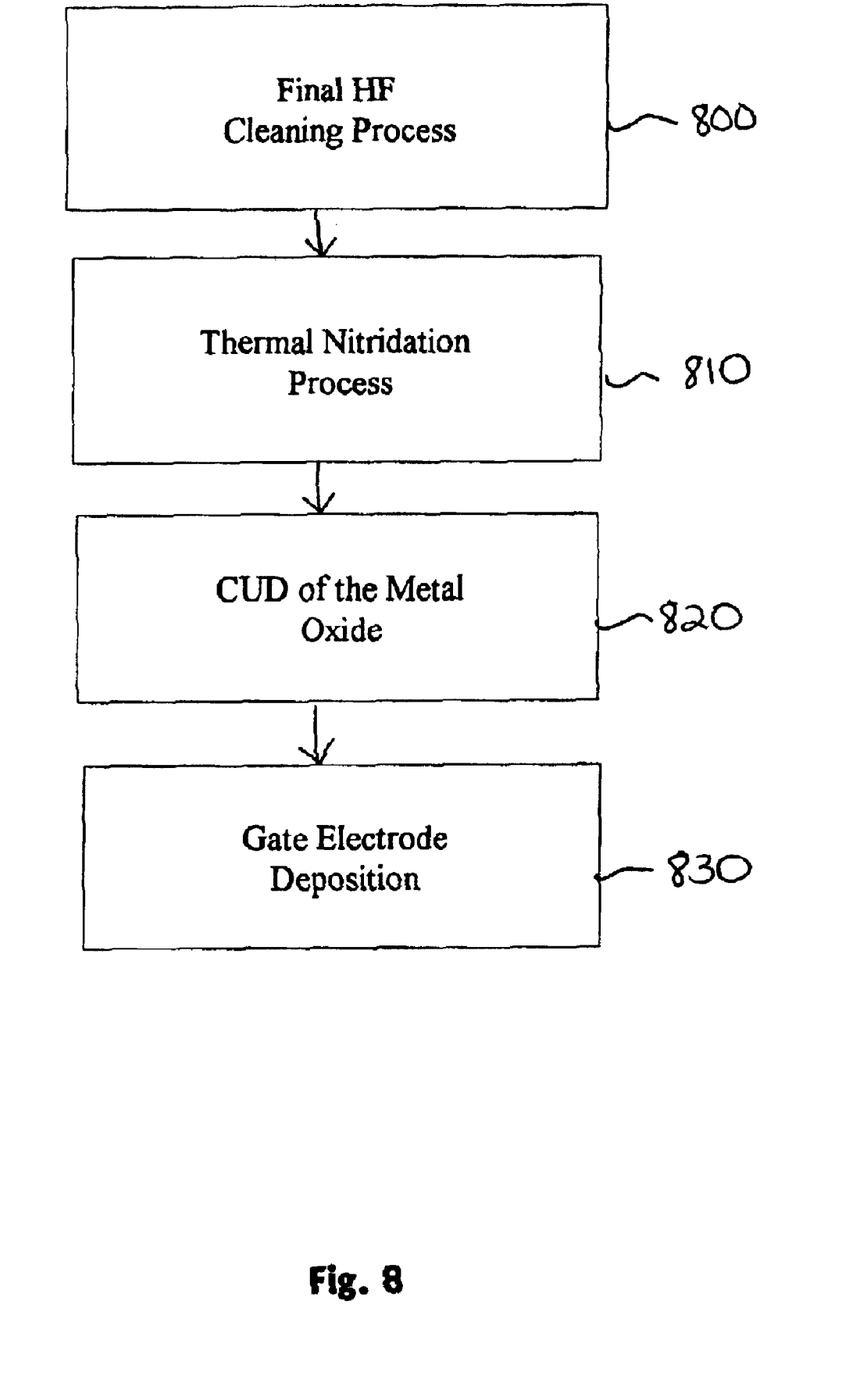
FIG. 8 is a flow diagram illustrating a preferred method of the invention.

Referring now to the drawings, and more particularly to FIGS. 1 through 8, there are shown preferred embodiments of the method and structures according to the present invention. Specifically, FIGS. 1 through 5 illustrate a partially completed metal-oxide-semiconductor field-effect transistor device 1 according to the present invention, and FIG. 6 illustrates a completed metal-oxide-semiconductor field-effect transistor device 1 according to the present invention. The preferred methods of the present invention are shown in FIGS. 7 and 8.

Figure 1:
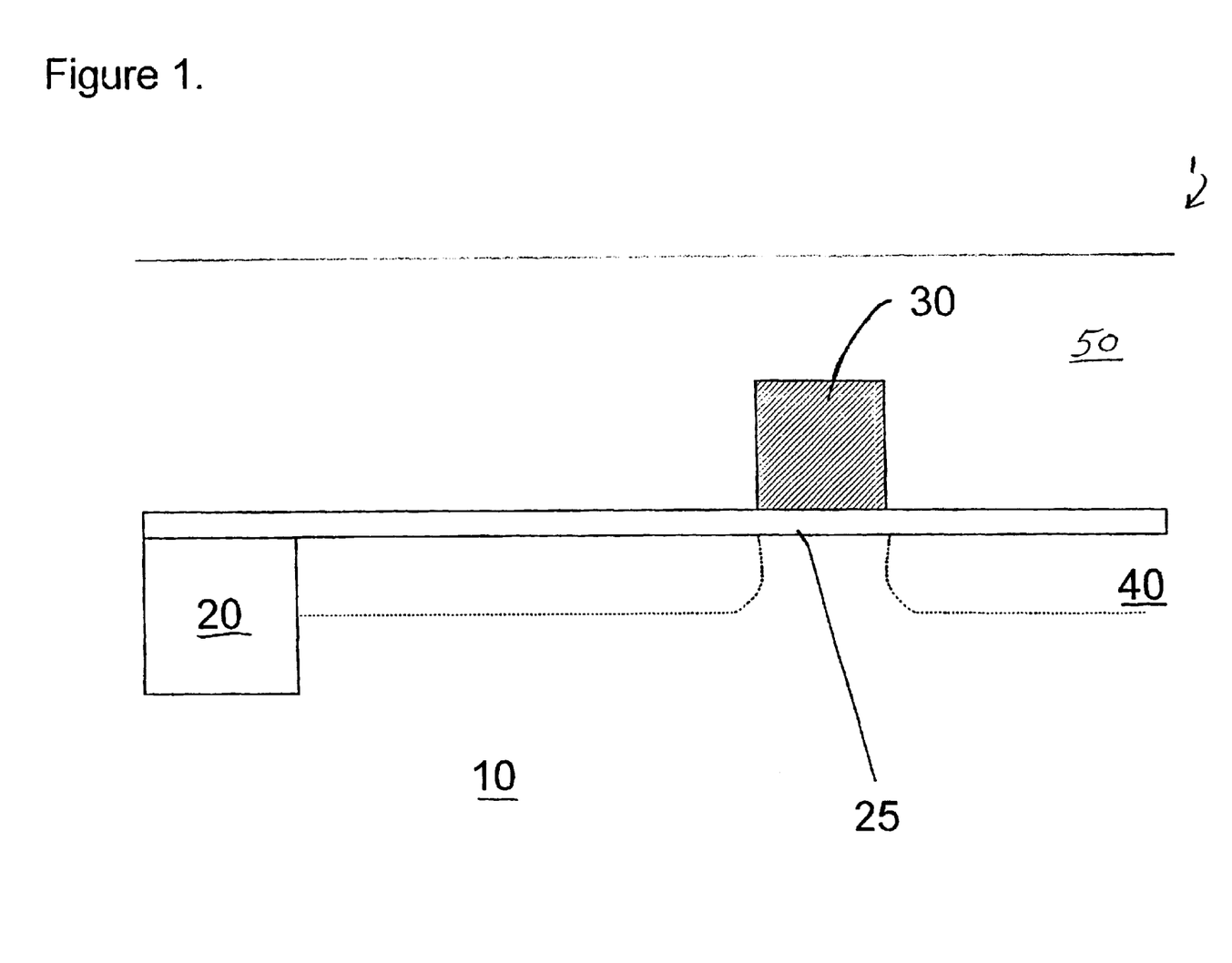
FIG. 1 is a cross-sectional schematic diagram of a partially completed metal-oxide-semiconductor field-effect transistor device according to the present invention.

FIG. 1 shows a partially completed MOSFET device 1 comprising a substrate 10, a shallow trench isolation (STI) region 20 and a source/drain diffusion region 40 formed in the substrate 10, a gate insulator 25 over the STI region 20, the substrate 10, and the source/drain diffusion region 40, a gate electrode 30 positioned over the gate insulator 25, and an insulator layer 50 over the gate electrode 30 and the gate insulator 25.

The substrate 10 preferably includes an impurity doping well, such as a silicon wafer, or silicon-on-insulator wafer. The STI region 20 is formed by conventional processing such as photolithography patterning, dry etching to a depth below the semiconductor junctions formed in subsequent processing steps as is known to those skilled in the art, oxide fill deposition, and planarization such as chemical mechanical polish (CMP).

The gate insulator 25 comprises a high dielectric constant material such as $HfO_x$ or $ZrO_x$, and is formed by a chemical vapor deposition (CVD) or physical sputtering to an equivalent oxide thickness (EOT) of 1 nm–5 nm. The gate electrode material 30 preferably comprises LPCVD polysilicon or TiN having a thickness of 5 nm–100 nm. Moreover, the gate electrode 30 is patterned by conventional lithography and dry etching techniques. Furthermore, the source/drain extension diffusion region 40 is formed by ion implantation.

Figure 2:
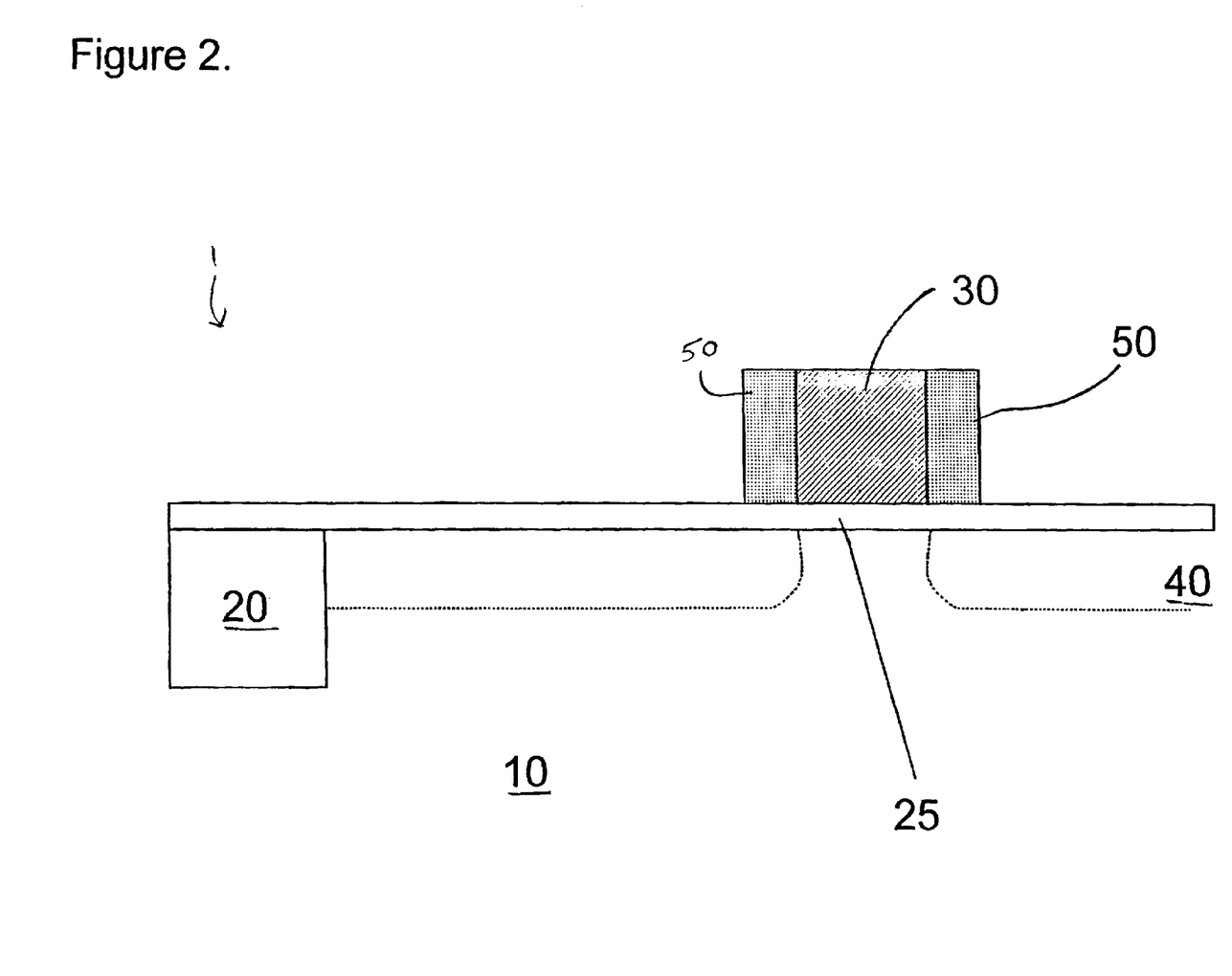
FIG. 2 is a cross-sectional schematic diagram of a partially completed metal-oxide-semiconductor field-effect transistor device according to the present invention.

FIG. 2 shows the device 1 after it has undergone an etching process, wherein the insulator layer 50 is etched to form a pair of gate sidewall spacers 50 on two sides of the gate electrode 30. The gate electrode 30 and spacers 50 form a protective cap. The spacers 50 are preferably formed by low-pressure chemical vapor deposition (LPCVD) of SiN to a thickness of 2 nm to 20 nm, and anisotropic dry etching such as flourine-containing plasma which is selective to the high-k gate dielectric 25 but not selective to the layer 50. That is, the etching process removes the layer 50 from above the gate electrode 30, and from all other areas above the high-k dielectric layer 25 except from the sidewall spacer regions 50 adjoining either side of the gate electrode 30. This does not substantially affect the dielectric 25 or gate 30. Thus, the etching process does not remove the gate electrode 30 or the high-k dielectric layer 25. Thus, according to the present invention, the layer 50 on top of the source/drain area is removed, and the underlying high-k dielectric is exposed.

Figure 3:
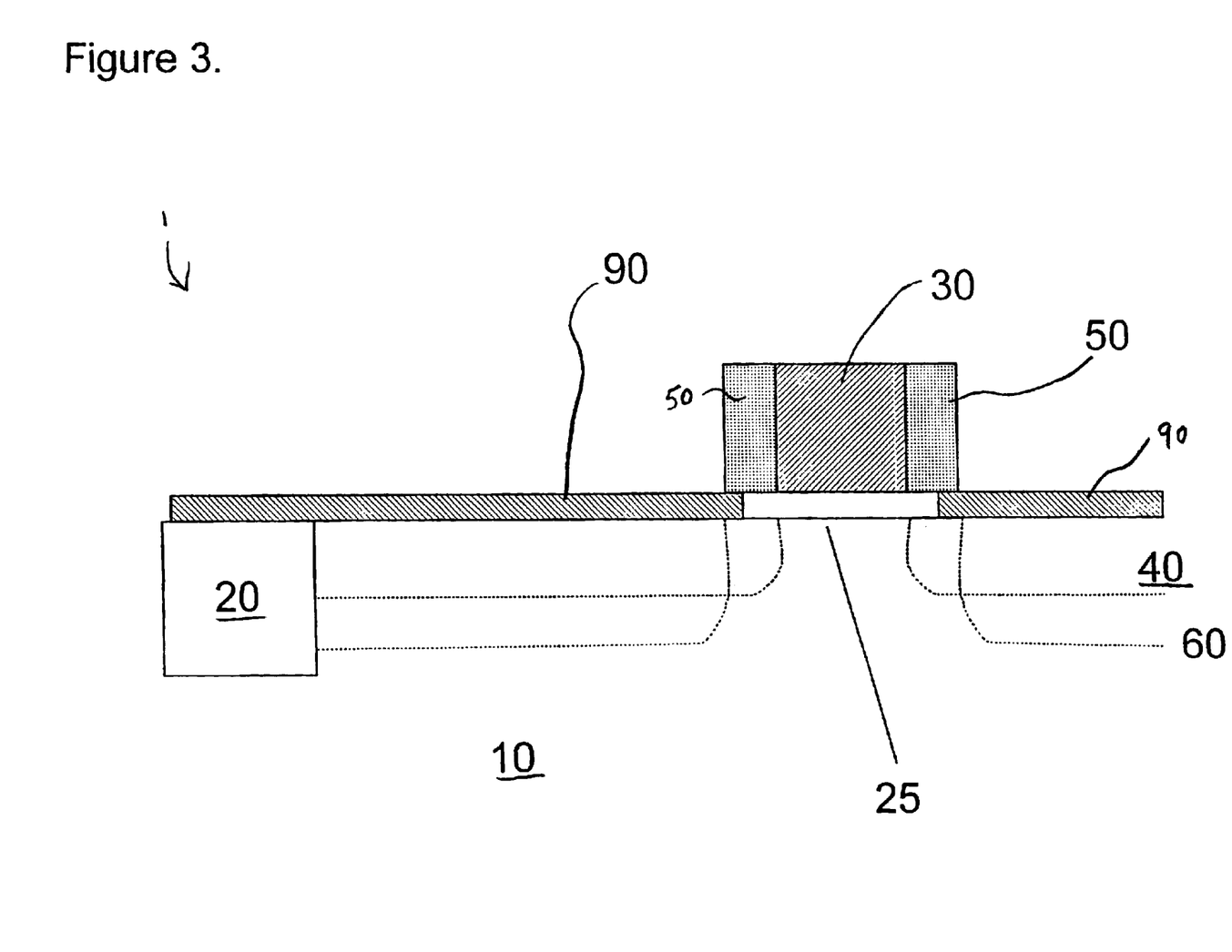
FIG. 3 is a cross-sectional schematic diagram of a partially completed metal-oxide-semiconductor field-effect transistor device according to the present invention.

FIG. 3 illustrates the conversion of the gate insulator 25 to a highly conductive metallic material 90 in regions not blocked by the protective cap formed by the gate electrode 30 and sidewall spacers 50. Furthermore, a deep high doping implant source/drain region 60 is also shown embedded in the substrate 10. The conversion preferably consists of a thermal annealing process in a reducing ambient such as $H_2$, and/or an annealing process in a vacuum to drive the oxygen out of the metal oxide film, i.e., to reduce the metal oxide. This process minimizes the overlap capacitance of the device 1.

The overlap capacitance is best illustrated in FIGS. 3–6, where it is seen that the portions of the high-k dielectric 25 extending under the spacers 50 (both sides) creates an overlap in the capacitance, thereby slowing the switching effects of the device 1. In other words, if a metal were formed beneath the spacers, a capacitor structure would exist that would slow the speed at which the transistor switched. Theoretically, the overlap capacitance can be eliminated by removing all excess high-k dielectric material 25 from underneath the spacers 50, thus only having the high-k dielectric positioned underneath the gate electrode 30. However, this could possibly lead to the metallic film 90 coming into contact with the gate electrode 30, which would cause device failure. Thus, the high-k dielectric material 25 is extended below the spacers 50 as a factor of safety. However, contrary to conventional devices, the present invention reduces the overlap capacitance in the device 1 by controlling the metal conversion step (conversion of high-k dielectric material 25 to the metal oxide 90) very precisely with the cap (spacers 50 and gate 30). Thus, since the positions of the metallic and insulating portions of the layer 25 are self-aligned and precisely controlled with the cap (spacers 50 and gate 30), a capacitor is not created under the spacers 50 and overlap capacitance is avoided.

FIG. 4 shows the formation of a self-aligned silicide (salicide) 100 from the conversion of at least a portion of the metallic material (metal oxide) 90 by an additional thermal step which causes a metal alloy 100 to form on the underlying substrate layer 10. The metal oxide 90 conversion to metal 100 occurs by annealing in a reducing ambient $H_2$ environment. Moreover, the silicide 100 is formed by a wet etching process as well. Thus, for example a metal oxide 90 comprising $HfO_x$ is converted to a Hf metal 100, or similarly, a metal oxide 90 comprising $ZrO_x$ is converted to a Zr metal 100 in this process.

The high-k material 90 on top of the shallow trench isolation region, however, may be used to form resistor components via extra masking steps. The sheet resistance of an annealed high-k dielectric on top of an insulating substrate can be in the range of kilo-ohm/square units to Mega-ohm/square units. These resistors are valuable for many applications. For example, they can be used to form a pull-up device for a SRAM cell, a resistor divider, or analog RC component. A chlorine-containing isotropic etch such as a wet solution is used to selectively remove the non-alloyed metallic material from over the STI 20. Because this is a self-aligning process, at least one metal deposition process is eliminated. Therefore, the present method reduces the fabrication cost of the device.

In FIG. 5, a cross section of the MOSFET device 1 is shown with a liner material 130 such as LPCVD SiN of thickness 2 nm to 30 nm deposited over the structure including the alloy 100, gate electrode 30, sidewall spacers 50, and the STI region 20. The liner material 130 serves as an etch stop layer for subsequent processing steps. An interlevel dielectric 150 such as boron and phosphorus doped glass (BPSG) is deposited over the liner material 130. Also, a contact via 200, which is formed by conventional lithographic, dry etch, metal deposition, and planarization techniques, is formed in the interlevel dielectric 150, and connects to the alloy 100.

FIG. 6 illustrates the inventive device 1 including a local interconnect region 120 over the STI region 20. The local interconnect region 120 is delineated by additional masking levels during the salicide formation process. Moreover, the interconnect 120 may be adapted to bridge between diffusion regions without the need to use the diffusion contact 200. The interconnect region 120 comprises the metallic material (metal oxide) 90.

Subsequent formation of interconnects (not shown) can proceed with conventional processing. It will be obvious to those skilled in the art that complementary n-channel and p-channel MOSFET (CMOS) devices can be produced using the method and structure as taught in this invention by application of impurity doping such as ion implantation to selected regions of the structure and substrate.

FIG. 7 illustrates a flow diagram of the entire process of forming a high performance MOSFET device 1 according to the present invention. The method comprises forming 700 a source region and drain region 40, and a trench region 20 in a substrate 10. Then, a first insulator 25 is formed 710 over the substrate 10. Next, a gate electrode 30 is formed 720 above the first insulator 25. After this, a dielectric layer 50 is deposited 730 above the gate electrode 30 and the first insulator 25. Upon completion of this step, a pair of insulating spacers 50 are formed 740 adjoining the electrode 30. Also, an additional high dopant implant source and drain region 60 may be formed 750 in the substrate 10. Next, a portion of the first insulator 90 is converted 760 into a metallic film 90. Then, the metallic film 90 is converted 770 into one of a silicide and a salicide film 100.

The method further comprises forming 780 an interconnect region 120 above the trench region 20 and forming 790 an etch stop layer 130 above the first insulator 25, the trench region 20, the gate electrode 30, and the pair of insulating space 50. Next, a second insulator As shown in FIG. 8, according to the present invention, for high-k CMOS gate dielectric 25 formation using Hr-oxide and Zr-oxide materials includes a final HF (hydrogen fluoride) cleaning process 800 for a hydrogen-terminated surface. Then, a thermal nitridation process 810 occurs such as a high-temperature step in a $NH_3$-containing ambient to form a silicon nitride (and/or oxynitride) layer of 5 angstroms to 15 angstroms, and preferably 8 angstroms. Next, a CVD process 820 occurs (atomic layer CVD or metal-organic CVD) of the metal oxide materials. Finally, a gate electrode deposition 830 occurs such as a CVD of silicon, or optionally with a TiN or other metallic barrier before the gate polysilicon deposition.

The present invention provides for a new self-aligned and low-cost silicidation process. While forming a MOS device with a high-k gate dielectric using a proper metal oxide such as $HfO_x$ or $ZrO_x$, the remaining high-k dielectric in the source/drain regions exposed to the air are converted into metal. One feature of the present process is the ability to block the high-k dielectric, which directly contacts the gate conductor, by using dielectric spacers 50. A subsequent silicidation process forms silicide alloy only in the source/drain region to reduce device series resistance. By controlling the metal conversion processing step, the overlap capacitance due to the gate and source/drain overlap with the high-k dielectric is also minimized. The high-K dielectric on top of the insulating substrate can also be used to form resistors. In short, a low-cost fabrication method to integrate very high-performance active and passive device is taught in this disclosure.

Which the invention has been described in terms of preferred embodiments, those skilled in the art will recognize that the invention can be practiced with modification within the spirit and scope of the appeneded claims.

What is claimed is:

1. A transistor device comprising:
    a substrate;
    a metallic film above said substrate;
    a gate electrode above said metallic film; and
    spacers adjacent said gate electrode,
    wherein said metallic film comprises a first region aligned below said gate electrode and a portion of said spacers; and second regions aligned below a portion of said spacers and spaced apart from said gate electrode, and
    wherein said second regions comprise a reduced oxygen content when compared to an oxygen content of said first region.

2. The transistor device of claim 1, wherein said first region comprises a metal oxide.

3. The transistor device of claim 1, wherein said metal oxide comprises one of a $MfO_x$ and a $ZrO_x$.

4. The transistor device in claim 1, wherein said second regions comprise a silicide region.

5. The transistor device in claim 1, further comprising source and drain regions in said substrate below said second regions.

6. The transistor device in claim 1, wherein said first region comprises a gate insulator.

7. The transistor device in claim 1, wherein said spaces are co-planar with said gate electrode.

8. The transistor device in claim 1, further comprising isolation regions in said substrate.

9. The transistor device in claim 8, further comprising a resistor over said isolation regions.

10. A transistor device comprising:

a substrate;

a metal oxide film above said substrate;

a metal alloy film above said substrate, and aligned with said metal oxide film, a gate electrode above said metal oxide film; and an insulator layer adjacent to a side portion of said gate electrode;

wherein said metal oxide film is configured below said gate electrode and a portion of said insulator layer;

wherein said metal alloy film is configured below a portion of said insulator layer and spaced apart from said gate electrode, and wherein said metal alloy film comprise a reduced oxygen content when compared to an oxygen content of said metal oxide film.

11. The transistor device in claim 10, wherein said metal alloy comprises a silicide region.

12. The transistor device in claim 10, further comprising source and drain regions in said substrate below said metal alloy film.

13. The transistor device in claim 10, wherein said metal oxide film comprises a gate insulator.

14. The transistor device in claim 10, wherein said insulator layer is co-planar with said gate electrode.

15. The transistor device in claim 10, further comprising isolation regions in said substrate.

16. The transistor device in claim 10, further comprising a resistor over said isolation regions.

17. A transistor device comprising:

a substrate;

a metal layer over said substrate, wherein sa d metal layer comprising a region and a second region;

a gate electrode over said first region; and insulator spacers adjacent to said gate electrode, wherein said fist region is aligned below said gate electrode and a portion of said insulator spacers, and said second region is aligned below a portion of said insulator spacers, wherein said first region is dimensioned to prevent said second region from contacting said gate electrode, and wherein said second region comprises a reduced oxygen content when compared to an oxygen content of said first region.

18. The transistor device in claim 17, wherein said second region comprises a silicide region.

19. The transistor device in claim 17, further comprising source and drain regions in said substrate below said second region.

20. The transistor device in claim 17, wherein said first region comprises a gate insulator.

* * * * *

UNITED STATES PATENT AND TRADEMARK OFFICE
CERTIFICATE OF CORRECTION

PATENT NO. : 6,794,721 B2
DATED : September 21, 2004
INVENTOR(S) : Clevenger et al.

It is certified that error appears in the above-identified patent and that said Letters Patent is hereby corrected as shown below:

Delete title page, and insert the attached title page.

Delete Fig 1-8 and substitute therefor the Figs consisting of Figs 1-8 as shown on the attached pages.

Signed and Sealed this

First Day of February, 2005

JON W. DUDAS
*Director of the United States Patent and Trademark Office*

(12) United States Patent
Clevenger et al.

(10) Patent No.: US 6,794,721 B2
(45) Date of Patent: Sep. 21, 2004

(54) INTEGRATION SYSTEM VIA METAL OXIDE CONVERSION

(75) Inventors: Lawrence A. Clevenger, LaGrangeville, NY (US); Louis L. Hsu, Fishkill, NY (US); Carl J. Radens, LaGrangeville, NY (US); Joseph F. Shepard, Jr., Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/328,650

(22) Filed: Dec. 23, 2002

(65) Prior Publication Data

US 2004/0119128 A1 Jun. 24, 2004

(51) Int. Cl.$^7$ ............... H01L 29/76; H01L 29/84; H01L 31/062; H01L 31/113; H01L 31/119
(52) U.S. Cl. ............... 257/369; 257/382; 257/384
(58) Field of Search ............... 257/20, 24, 192, 257/202, 288, 310, 368, 369, 382, 384, 388, 412, 413

(56) References Cited

U.S. PATENT DOCUMENTS 6,657,244 B1 * 12/2003 Dokumaci et al. ......... 257/288

* cited by examiner

*Primary Examiner*—Hoai Pham
(74) *Attorney, Agent, or Firm*—McGinn & Gibb, PLLC; Derek S. Jennings (57) ABSTRACT

A method and structure for a transistor device comprises forming a source, drain, and trench region in a substrate, forming a first insulator over the substrate, forming a gate electrode above the first insulator, forming a pair of insulating spacers adjoining the electrode, converting a portion of the first insulator into a metallic film, converting the metallic film into one of a silicide and a salicide film, forming an interconnect region above the trench region, forming an etch stop layer above the first insulator, the trench region, the gate electrode, and the pair of insulating spacers, forming a second insulator above the etch stop layer, and forming contacts in the second insulator. The first insulator comprises a metal oxide material, which comprises one of a $HfO_x$ and a $ZrO_x$.

20 Claims, 8 Drawing Sheets